(12) United States Patent
Barnett et al.

(10) Patent No.: US 6,903,380 B2
(45) Date of Patent: *Jun. 7, 2005

(54) HIGH POWER LIGHT EMITTING DIODE

(75) Inventors: Thomas J. Barnett, Powell, OH (US); Sean P. Tillinghast, Bexley, OH (US)

(73) Assignee: Weldon Technologies, Inc., Hilliard, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/411,707

(22) Filed: Apr. 11, 2003

(65) Prior Publication Data

US 2004/0201025 A1 Oct. 14, 2004

(51) Int. Cl.$^7$ ................................................ H01L 33/00
(52) U.S. Cl. ............................ 257/98; 257/99; 257/100
(58) Field of Search .................................. 257/98–100

(56) References Cited

U.S. PATENT DOCUMENTS

| | | | |
|---|---|---|---|
| 3,760,237 A | 9/1973 | Jaffe | 317/234 |
| 4,478,588 A | 10/1984 | Lockard | 445/22 |
| 4,727,283 A | 2/1988 | van Kemenade et al. | 313/487 |
| 4,882,617 A | 11/1989 | Vriens | 358/60 |
| 5,514,627 A | 5/1996 | Lowery et al. | 437/209 |
| 5,557,115 A | 9/1996 | Shakuda | 257/81 |
| 5,578,839 A | 11/1996 | Nakamura et al. | 257/96 |
| 5,606,182 A | 2/1997 | Yoshida et al. | 257/99 |
| 5,648,687 A | 7/1997 | Matsuo et al. | 257/787 |
| 5,652,434 A | 7/1997 | Nakamura et al. | 257/13 |
| 5,798,537 A | 8/1998 | Nitta | 257/103 |
| 5,813,752 A | 9/1998 | Singer et al. | 362/293 |
| 5,813,753 A | 9/1998 | Vriens et al. | 362/293 |
| 5,847,507 A | 12/1998 | Butterworth et al. | 313/512 |
| 5,910,661 A | 6/1999 | Colvin, Jr. | 250/573 |
| 5,998,925 A | 12/1999 | Shimizu et al. | 313/503 |
| 6,051,849 A | 4/2000 | Davis et al. | 257/103 |
| 6,084,252 A | 7/2000 | Isokawa et al. | 257/98 |
| 6,158,882 A | 12/2000 | Bischoff, Jr. | 362/488 |
| 6,163,038 A | 12/2000 | Chen et al. | 257/103 |
| 6,204,523 B1 | 3/2001 | Carey et al. | 257/98 |
| 6,274,924 B1 | 8/2001 | Carey et al. | 257/676 |
| 6,541,800 B2 * | 4/2003 | Barnett et al. | 257/98 |
| 2002/0113244 A1 * | 8/2002 | Barnett et al. | 257/98 |

OTHER PUBLICATIONS

EP 1 059 667 A (Sanyon Electric Co) Dec. 13, 2000.
Patent Abstracts of Japan vol. 2000, No. 19 Jun. 5, 2001 & JP 2001 036143 A (Stanley Electric Co. Ltd), Feb. 9, 2001.
GB 2 343 549 A (Hewlett Packard Co) May 10, 2000.
EP 0 854 523 A (Tokyo Shibaura Electric Co) Jul. 22, 1998.
Patent Abstracts of Japan vol. 1997, No. 04, Apr. 30, 1997 & JP 08 335719 A (Nichia Chem Ind Ltd), Dec. 17, 1996.

* cited by examiner

Primary Examiner—Mark V. Prenty
(74) Attorney, Agent, or Firm—James R. Eley; Michael A. Forhan; Eley Law Firm Co.

(57) ABSTRACT

A method and system are taught for a system comprising an LED package. The LED package may comprise a leadframe having an annular contact and a base contact. An LED die may be coupled to the annular and base contacts such that the P-type material portion is electrically connected to an annular contact and the N-type material portion is electrically connected to a base contact. Alternatively the N-type material portion may be electrically connected to the annular contact and the P-type material portion may be electrically connected to the base contact. A lens may be coupled to the leadframe, and an optical material may be located in a cavity defined by the lens, the base contact, and the annular contact. The optical material may be a gel, a grease, a resilient material, a non-resilient material, a rigid material, a liquid material or a non-liquid material. The method and system may further comprise a mounting device, wherein the LED package is mechanically coupled to the mounting device in a socket, bayonet, or threaded fashion. The method and system may further comprise a strip comprising an array of annular contacts utilized to form an array of the LED packages and a carrier strip comprising receiving devices to receive the array of LED packages. A portion of the lens may either be coated with or comprise light excitable material or the optical material may comprise light excitable material, such that the system emits white light.

53 Claims, 17 Drawing Sheets

HIGH POWER LIGHT EMITTING DIODE

FIELD OF THE INVENTION

The embodiments of the present invention relate generally to packaging for light emitting diodes ("LEDs"). One aspect of the embodiments may be to produce an optically efficient LED that can generate a higher degree of illumination per unit area than is currently available in the art. Another aspect of the embodiments may be to provide a means of mechanically attaching the device to a light fixture or printed circuit board. Yet another aspect of the embodiments may be to provide an improved package for LEDs and a method for packaging multiple LEDs on strips, to better facilitate automated manufacturing methods for assemblies utilizing the LEDs. Still another aspect of the embodiments may be to provide a means of producing a white light from a single LED package. Yet another aspect of the embodiments may be to provide a means of mounting multiple LED dice within a single LED package.

PRIOR ART

The art of manufacturing the light emitting component of LEDs is widely described in the art and well known to those so skilled. Furthermore, the art of producing white LEDs is well known and described in the art. Pertinent patents include: U.S. Pat. No. 5,813,752 issued to Singer et al. on Sep. 29, 1998, entitled "UV/Blue LED-Phosphorus Device With Short Wave Pass, Long Wave Pass Band Pass and Peroit Filters," which describes the use of a layered blue/UV LED semiconductor having a top layer of phosphor and filters for producing white light; U.S. Pat. Nos. 5,998,928 and 6,060,440 issued to Shimizu et al. on Dec. 7, 1999 and May 20, 2000, respectively and each entitled "Light Emitting Device Having A Nitride Compound Semiconductor And A Phosphor Containing A Garnet Fluorescent Material," which describe the design of white LEDs that utilize blue LEDs to excite a layer of phosphor material comprising garnet fluorescent materials activated with cerium and/or including the use of dispersing materials surrounding the phosphor containing components to diffuse the resulting illumination.

The structural makeup of various LED packages are also disclosed in the technical data sheets of a number of commercial LED manufacturers, see for example, the technical data sheets for "Super Flux" LEDs, by LumiLeds (a joint venture between Philips Lighting and Agilent Technology); "SnapLED 150" LEDs, by LumiLeds; "Six LED High Mount Stop Light Array," by LumiLeds; "Luxeon Star," by LumiLeds; and "Shark Series High Flux LED Illuminators," by Opto Technology, Inc.

BACKGROUND OF THE INVENTION

A light emitting diode (LED) is a compact semiconductor device that generates light of various colors when a current is passed through it. The color depends primarily upon the chemical composition of the light emitting components of the LED die. LEDs exhibit various advantages over incandescent, fluorescent, and discharge light sources, including smaller size, longer life, lower power requirements, good initial drive characteristics, high resistance to vibration and high tolerance to repeated power switching. Because of these favorable characteristics LEDs are widely used in such applications as indicators and low-power lighting applications.

Recently red, green and blue ("RGB") LEDs having high luminance and efficiencies have been developed and employed as pixel elements in large screen LED displays and signs. This type of LED display can be operated with less power consumption than the prior art, such as incandescent lamps, and has additional favorable characteristics such as light weight and long life. Demand for LEDs as an alternative to prior art display pixel elements is burgeoning.

Although LEDs are more efficient than prior art light sources, they are not 100% efficient in converting electrical energy to light. As a result, a great deal of heat can be produced by the LED die. If the heat is not adequately dissipated, mechanical stress is imposed on various internal components of the LED due to the differing coefficients of thermal expansion of the internal components. This stress can lead to failure of the LED. Therefore, heat sinks are often employed to dissipate heat generated by the LED. The heat sink is usually provided through the metal leadframe of the LED.

The amount of heat generated by the LED becomes an even greater concern as higher-power LEDs are developed for high-brightness applications. Some manufacturers have produced more powerful LEDs having large heat sinks but at a trade-off. First, if an LED with a large heat sink is soldered using conventional methods (i.e. wave solder, reflow solder), the heat from the soldering process is transferred to the LED die, which may cause failure of the LED. Second, if the LED is soldered using non-conventional techniques (i.e. bar soldering or laser soldering), this must generally be performed by the LED manufacturer due to the heat sensitive nature of the process. Therefore, the LED manufacturer often provides a high power LED as a pre-packaged component. Unfortunately, the configuration of the package may not be compatible with the physical space requirements of the intended end product design.

In addition, optical coupling of the LED to an associated lens is inefficient. Generally, an LED consists of a semiconductor die adhered to a substrate using an optically clear epoxy. This direct interface of the die (which has a typical index of refraction "n" of about 3.40) to the epoxy (having a typical index of refraction "n" of about 1.56) creates a significant index of refraction gradient between the two materials. As light travels from a medium of high index of refraction to low index of refraction, Fresnel losses are experienced due to the inability of the light to escape the package as a result of internal reflection. Therefore, a material or a layer of material that minimizes the index of refraction gradient is desired to decrease the Fresnel losses that would otherwise occur.

Furthermore, because the epoxy used to encapsulate the conventional LED die is generally rigid when fully cured, thermal expansion of the LED components can cause a degree of shear and tensile stress on the bonds between the bonding wires that connect between the electrical contacts and the LED die. A means of reducing stress on the bonding wires as a result of thermal expansion of the LED components is needed.

Finally, when incorporated into various product applications, LEDs (in their numerous package designs) are generally designed to be assembled onto a printed circuit board ("PCB") and secured using a soldering process. However, an LED package that can be assembled into products using mechanical processes, such as pin-and-socket arrangements, is desired so that the LED is more adaptable for automated manufacturing processes, consumes less PCB space than previously required, and can accommodate a wider variety of product designs. A mechanical means to install LEDs into a product rather than soldering is also needed to reduce the amount of heat to which the LED die is exposed, thereby eliminating a significant source of LED failure. In addition, an LED is needed that can provide substantially greater heat sinking than that provided by conventional LEDs coupled to a printed circuit board.

SUMMARY

One embodiment of the present invention provides a system comprising an LED package. The LED package comprises at least one LED die. The LED die is a semiconductor diode having an N-type semiconductor material portion joined to a P-type semiconductor material portion at a "P-N junction." When electrical energy is applied to the LED die such that electrons flow from the N-type material portion to the P-type material portion, light is emitted from the die. An electrical contact connected to the P-type material portion is called an "anode" and the electrical contact connected to the N-type material portion is called a "cathode." The anode and/or cathode contacts may be annular in shape. The anode and/or cathode contacts may be incorporated into a leadframe having coupling devices adapted to assemble the LED package onto a PCB or into a product. The LED die and a lens are coupled to the leadframe. The LED package may also comprise an optical material located in a cavity defined by the lens and the leadframe.

Another embodiment of the present invention provides a system comprising a mounting device and an LED package. The LED package comprises a leadframe having an annular contact with a central opening and a heat sink adjacent the central opening, an LED die coupled to the heat sink and annular contact, and a lens coupled to the leadframe. The lens comprises protrusions that are utilized to mechanically secure the LED package to the mounting device. The LED package further comprises an optical material located in a cavity defined by the lens and the leadframe.

Another embodiment of the present invention provides a method for making a system with an LED package. The making of the LED package comprises the steps of: a) providing a leadframe having an annular contact with a concentric opening and a heat sink with a die cup, b) coupling at least one LED die to the die cup of the heat sink, c) coupling the LED die to the annular contact through the concentric opening, d) dispensing an optical material into a cavity defined by the lens, the annular contact, and the heat sink, and e) coupling a lens to the leadframe.

Another embodiment provides a system comprising an LED package. The LED package comprises two or more contacts, any of which may be annularly shaped. The LED package also comprises at least one LED die coupled to the contacts and a lens coupled to the contacts. The LED package also comprises a cavity defined by the lens and the contacts.

Another embodiment of the present invention provides a system comprising an LED package. The LED package comprises an anode contact coupled with a cathode contact. The LED package also comprises at least one LED die coupled to the cathode contact and the anode contact and a lens coupled to one or both of the contacts. The LED package also comprises an optical material located in a cavity defined by the lens, the cathode contact, and the anode contact.

Another aspect may be that the optical material is a gel, a grease, a viscous material, a rigid material, a resilient material, a non-resilient material, a liquid material or a non-liquid material.

Another aspect may be that the system comprises a mounting device, where the LED package is mechanically coupled to the mounting device via the lens.

Another aspect may be that the system comprises a mounting device, where the LED package is mechanically coupled to the mounting device via the base contact.

Another aspect may be that the system further comprises an anode strip comprising an array of contacts utilized to form an array of the LED packages and a carrier strip comprising receiving devices to receive the array of LED packages.

Another aspect may be that a portion of the lens is either coated with or comprises light excitable material such that the system emits white light. Another aspect may be that an optical material such as silicone or viscous material includes light excitable material such that the system emits white light.

Another aspect may be that a plurality of LED dice are used.

Another aspect may be that the annular contact is segmented to allow isolated contact to each LED die in the package.

Another aspect may be that the segmented annular contact is arranged in a manner such that the flexible extensions have differing diametral pitches to provide isolated contact to each flexible extension while maintaining radial symmetry.

Another aspect may be that a plurality of LED die with insulating substrate are used. The LED die are electrically connected in series to one another, to the annular contact and the base contact via wire bonding.

BRIEF DESCRIPTION OF THE DRAWINGS

Further features of the present invention will become apparent to those skilled in the art to which the present embodiments relate from reading the following specification and claims, with reference to the accompanying drawings, in which:

DESCRIPTION OF THE PREFERRED EMBODIMENT(S)

Figure 1:
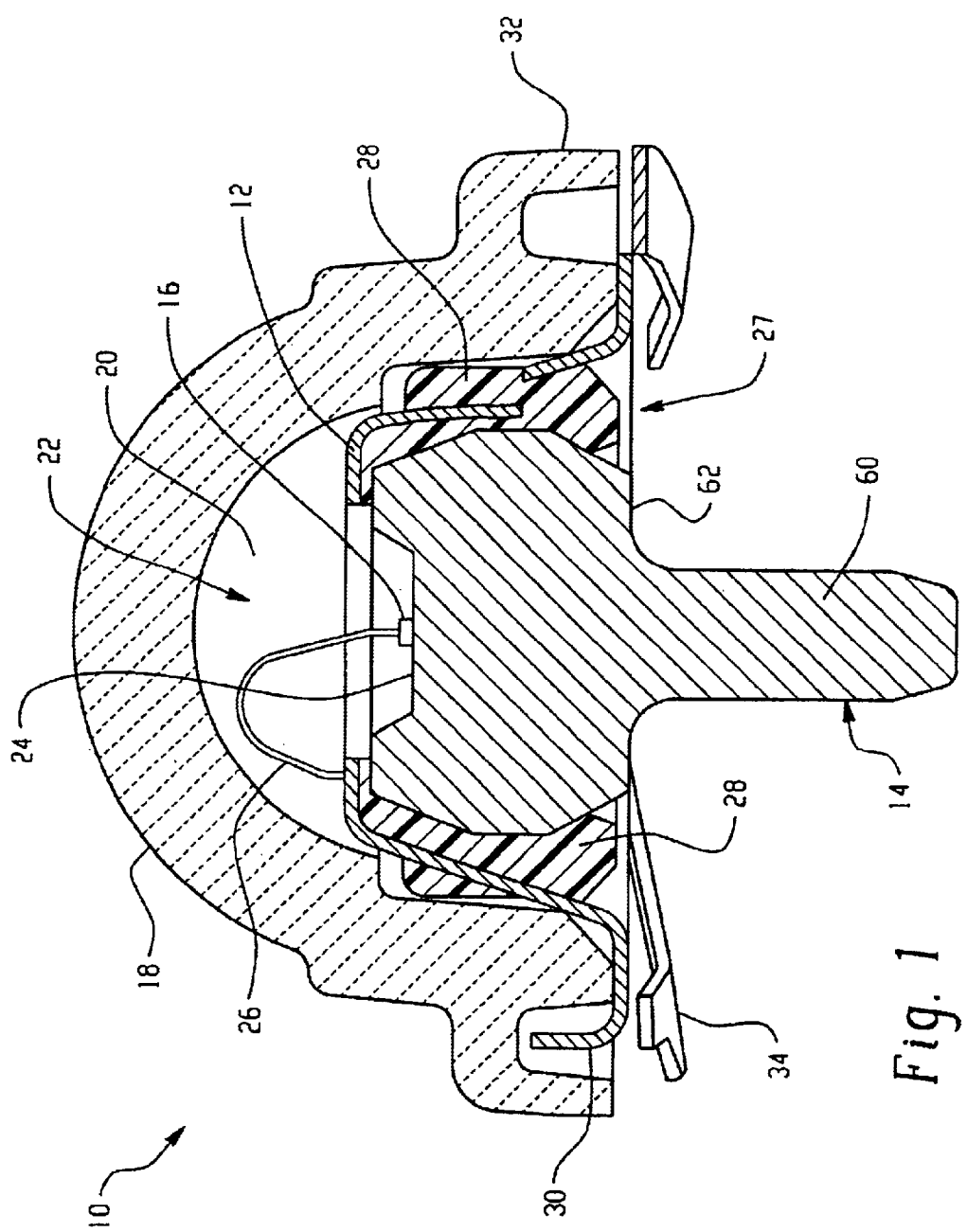
FIG. 1 is a cross sectional view of one embodiment of an LED package.

With reference to FIGS. 1–4, an LED package 10 of a system 100 is shown. The LED package 10 comprises an annular contact 12, a base contact, 14, an LED die 16, and a lens 18. The annular contact 12 and base contact 14 may each be configured as either an anode or as a cathode for the LED die 16, as desired. An optical material 20 may be located in a cavity 22 defined by the annular contact 12, the base contact 14, and the lens 18. The optical material 20 may be a silicone material, a gel or grease, a non-resilient material, a non-liquid material, or the like. In other embodiments the cavity 22 may contain a liquid, viscous, resilient, rigid or solid optical material 20 or may not contain any material. The optical material 20 may be "UV-stable" to resist degradation due to exposure to ultraviolet radiation, such as from sunlight.

The LED die 16 may be coupled to the annular contact 12 via a wire bonding 26. The LED die 16 may also be coupled to a die cup 24 of the base contact 14 by solder or a thermally and electrically conductive adhesive, such as an epoxy. The die cup 24 may have reflective surfaces to aid in the distribution of light emitted by the LED die 16. A leadframe 27 may be assembled by coupling the base contact 14 to the annular contact 12 through use of a coupling material 28, which may be liquid crystal polymer or the like, so long as the material is thermally conductive and electrically insulating. After dispensing the optical material 20 into the cavity 22, the lens 18 is coupled to the leadframe 27 via complementary coupling devices 30 which may be, for example, barbs or tabs, and coupling devices 31 which may be, for example, receiving openings. In another embodiment, the lens 18 may be coupled to the leadframe 27 with an adhesive, such as an epoxy.

Figure 2:
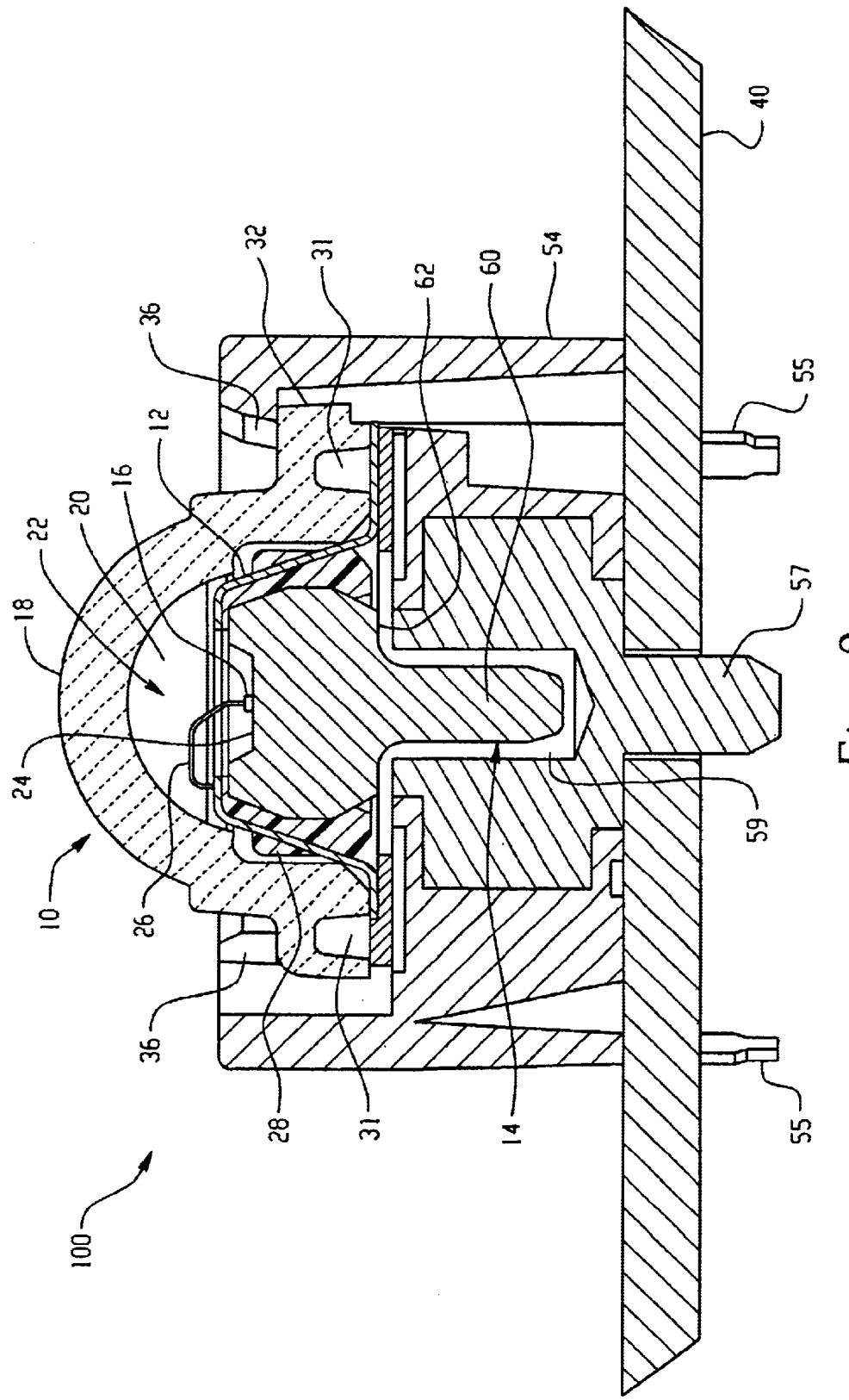
FIG. 2 is a cross sectional view of one embodiment of a system.
Figure 3:
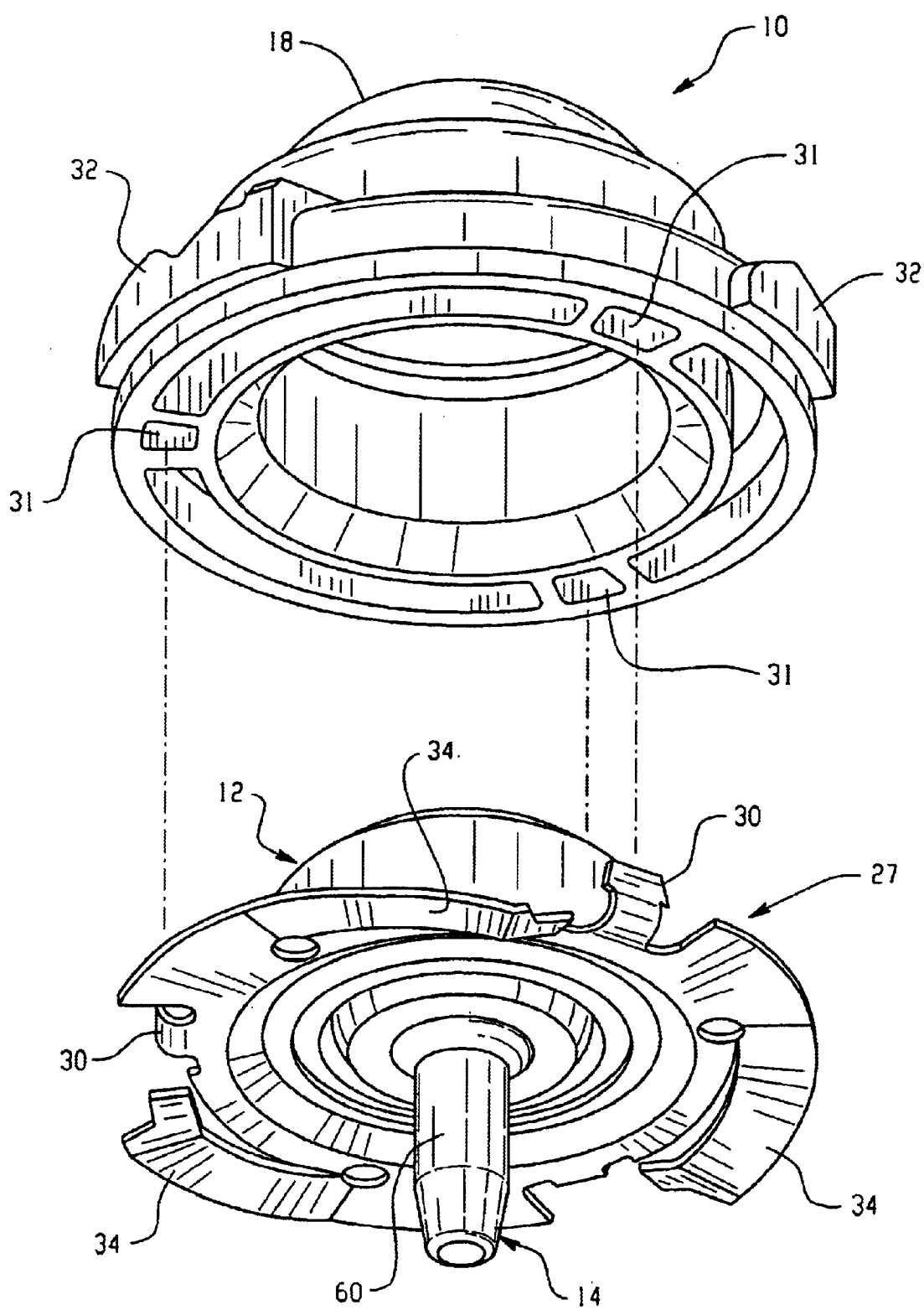
FIG. 3 is an exploded view of one embodiment of an LED package.
Figure 4:
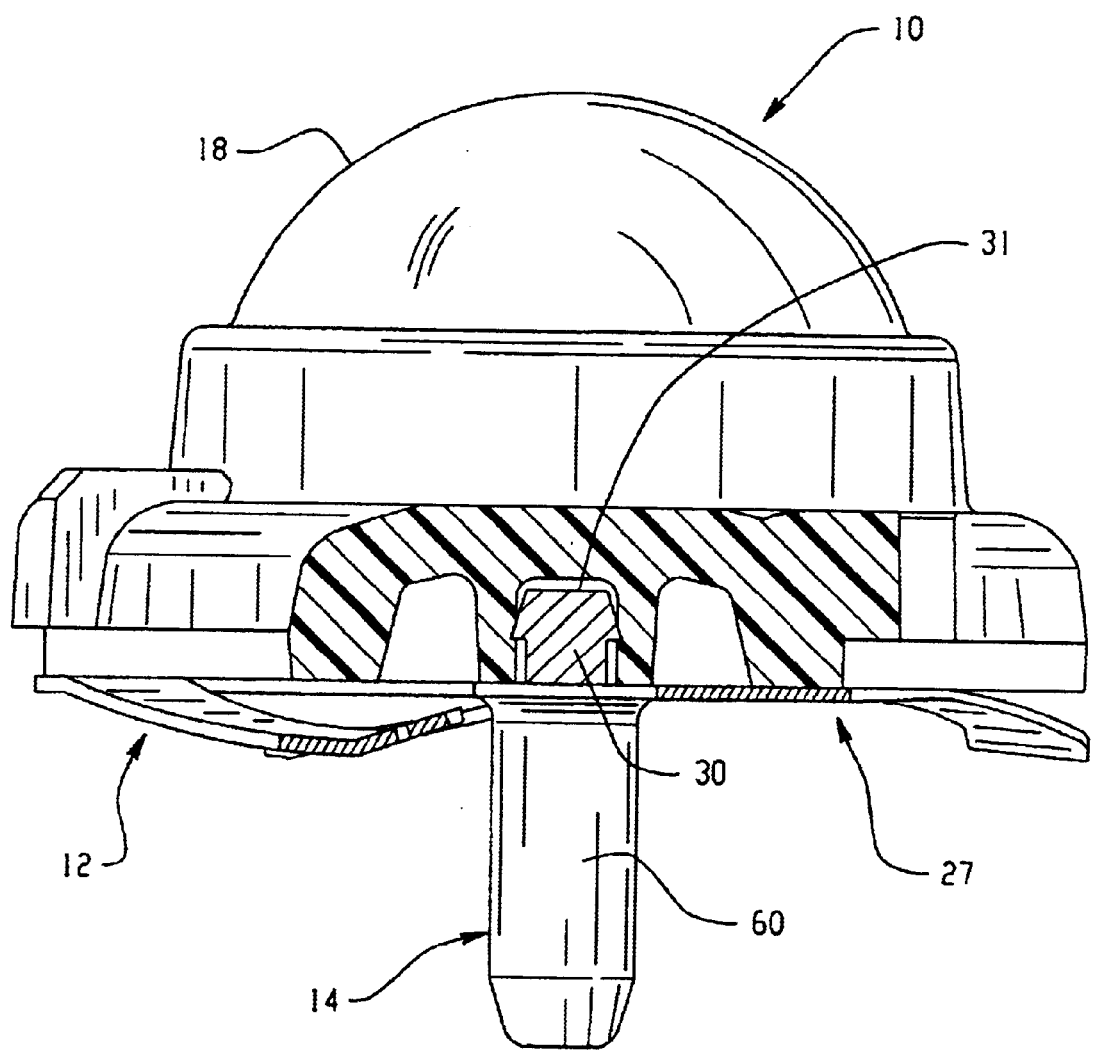
FIG. 4 is a partial cross section view of a section of one embodiment of an LED package.
Figure 5:
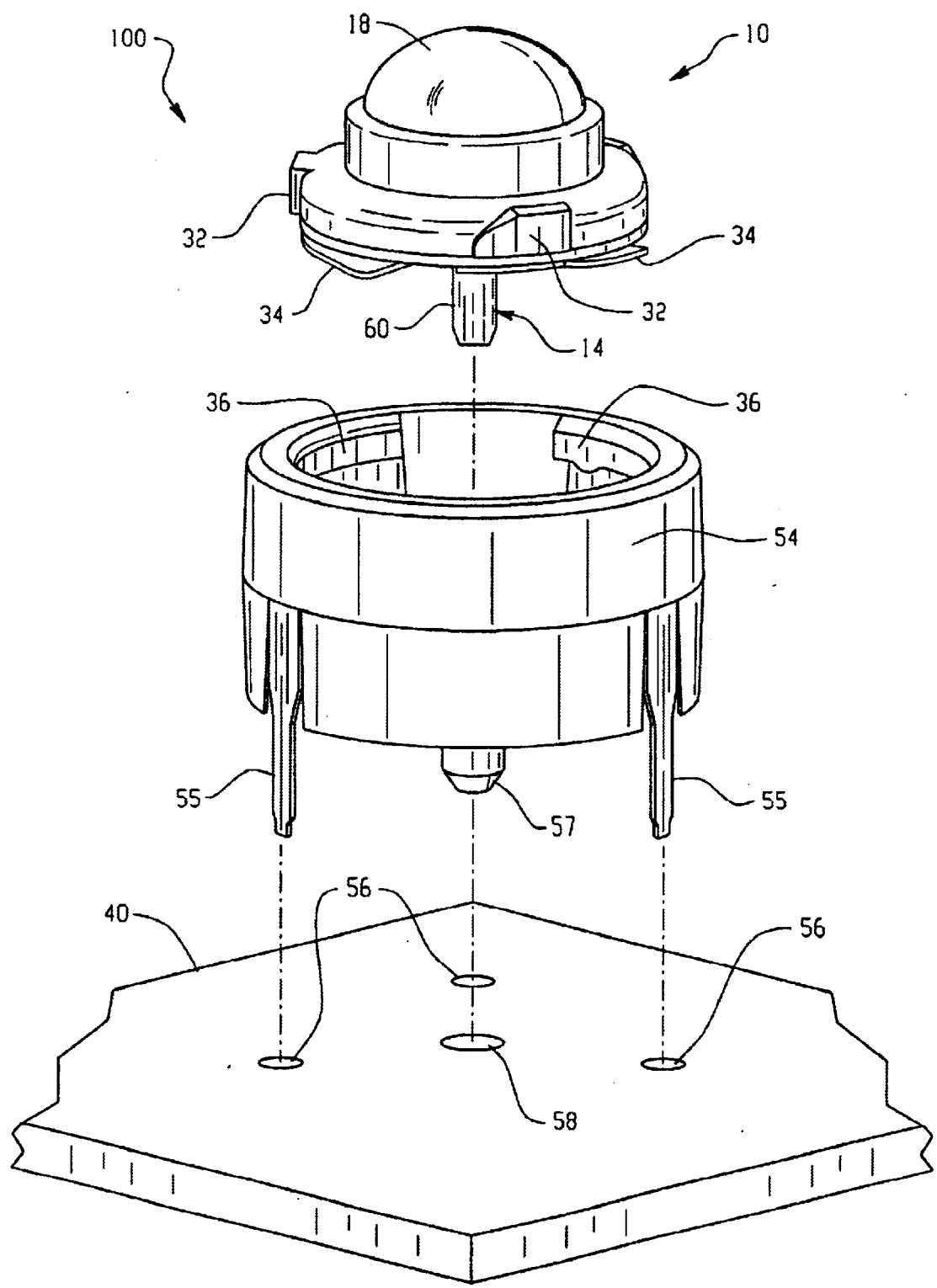
FIG. 5 is an illustration of another embodiment of a system comprising a printed circuit board, a mounting device and an LED package.

With reference to FIG. 5 and continued reference to FIGS. 1–3, a system 100 is illustrated according to an embodiment of the present invention. The lens 18 of the LED package 10 further comprises protrusions 32, which may be lens "feet," that allow the LED package 10 to be removeably secured in a coupling device 36 of a mounting device 54 in a socket-like fashion, wherein the feet 32 are biased against the coupling device 36 via flexible extensions 34 extending from a peripheral portion of the annular contact 12. The flexible extensions 34 may also serve as contacts to electrically couple the annular contact 12 to corresponding contacts in the mounting device 54, or to corresponding lands on a printed circuit board ("PCB") 40. The mounting device 54 extensions 55 extending from the mounting device 54 are received in openings 56 in PCB 40 and extension 57 extending from the mounting device 54 is received in opening 58 in the PCB 40 to couple the mounting device 54 to the PCB 40. Within the mounting device 54, an opening 59 (not shown) receives the base contact post 60. The opening 59 may have a corresponding contact to detachably couple to the base contact post 60 to complete the electrical connection to the LED package 10.

Figure 6:
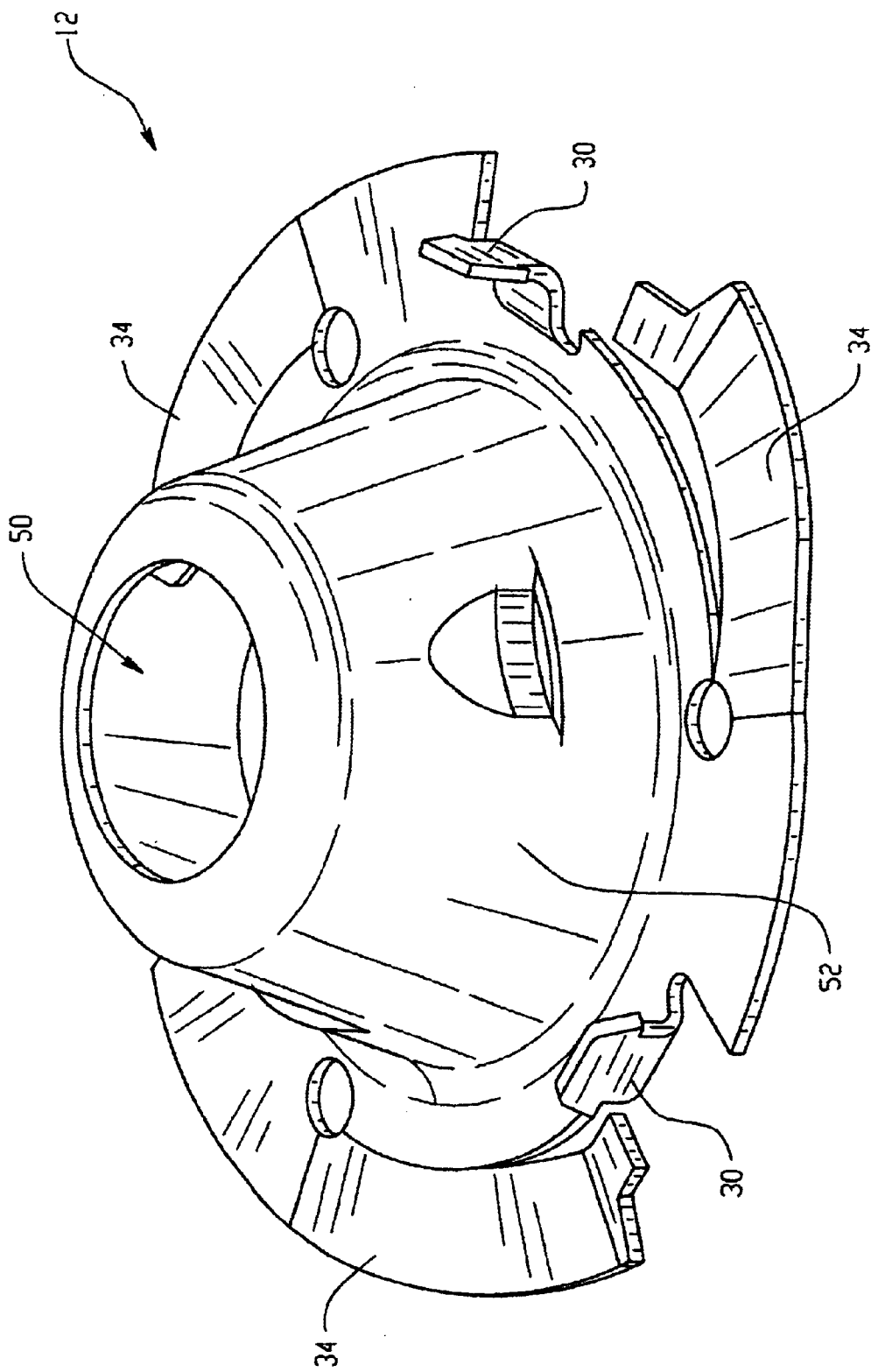
FIG. 6 is a perspective view of an annular contact according to several embodiments.

The annular contact 12 forms a portion of the leadframe 27 for the LED package 10 and is further designed to provide a large surface area for sinking heat generated during use. The shape has the still further benefit of reducing thermal expansion due to hoop stresses inherent with the annular geometry. As best seen in FIG. 6 in combination with FIG. 1, in the circular embodiment shown the annular contact 12 somewhat resembles an inverted pie pan having a centralized, preferably concentric window 50 formed in the "bottom" 52 providing access to the LED die 16 and wire bonding 26, and through which light emitted from the LED die 16 is distributed to the lens 18. However, other embodiments contemplate other generally symmetrical shapes, which are equally well suited as leadframe portions, as is the annular embodiment. As discussed above, in one embodiment of the present invention the stamped barbs 30 are formed about the periphery of a body of the annular contact 12 for captive engagement between the annular contact and the receiving openings 31 of the lens 18 during assembly of the LED package 10.

Figure 7:
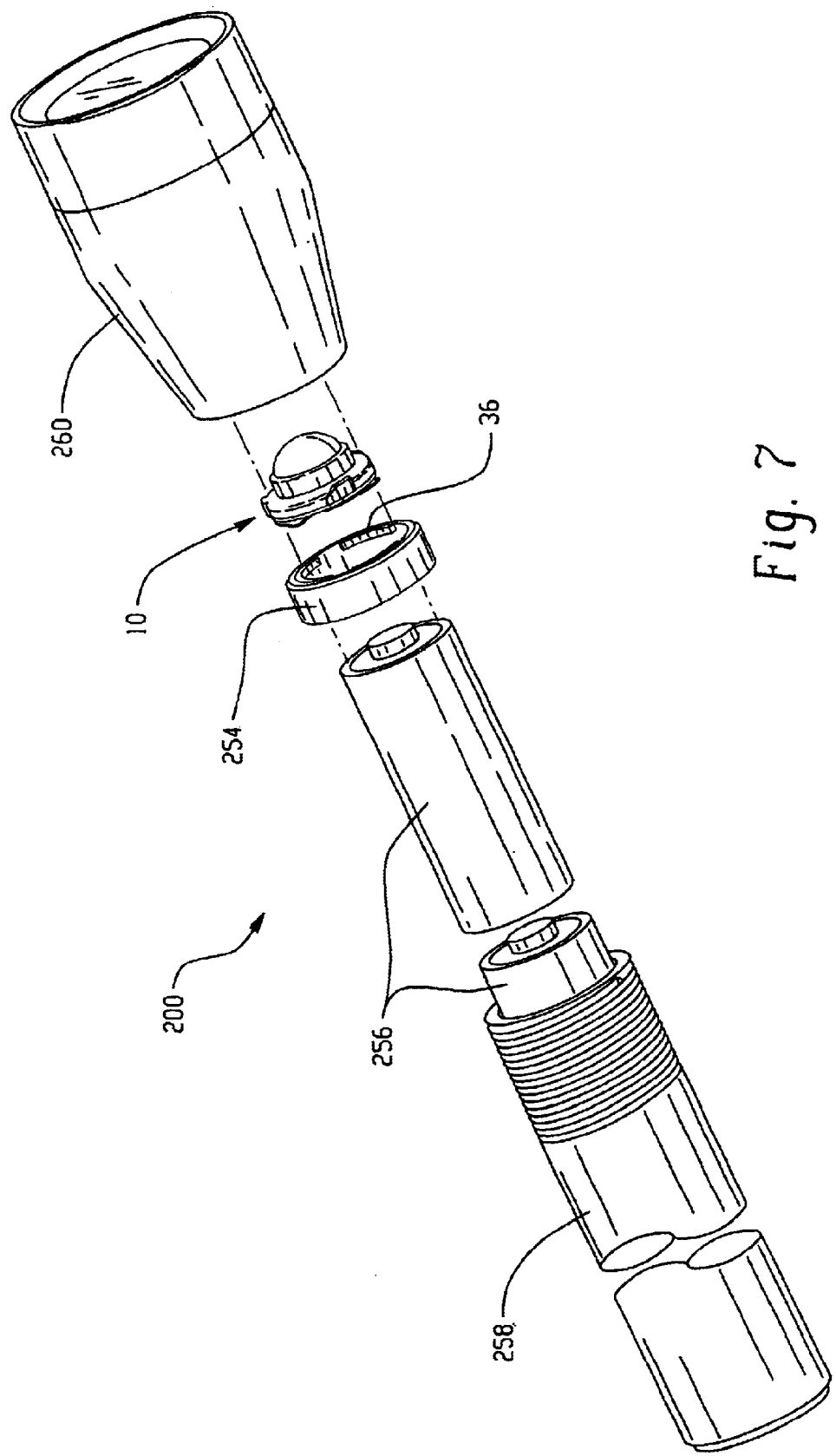
FIG. 7 is an illustration of an embodiment of the system comprising a housing and an LED package.
Figure 8:
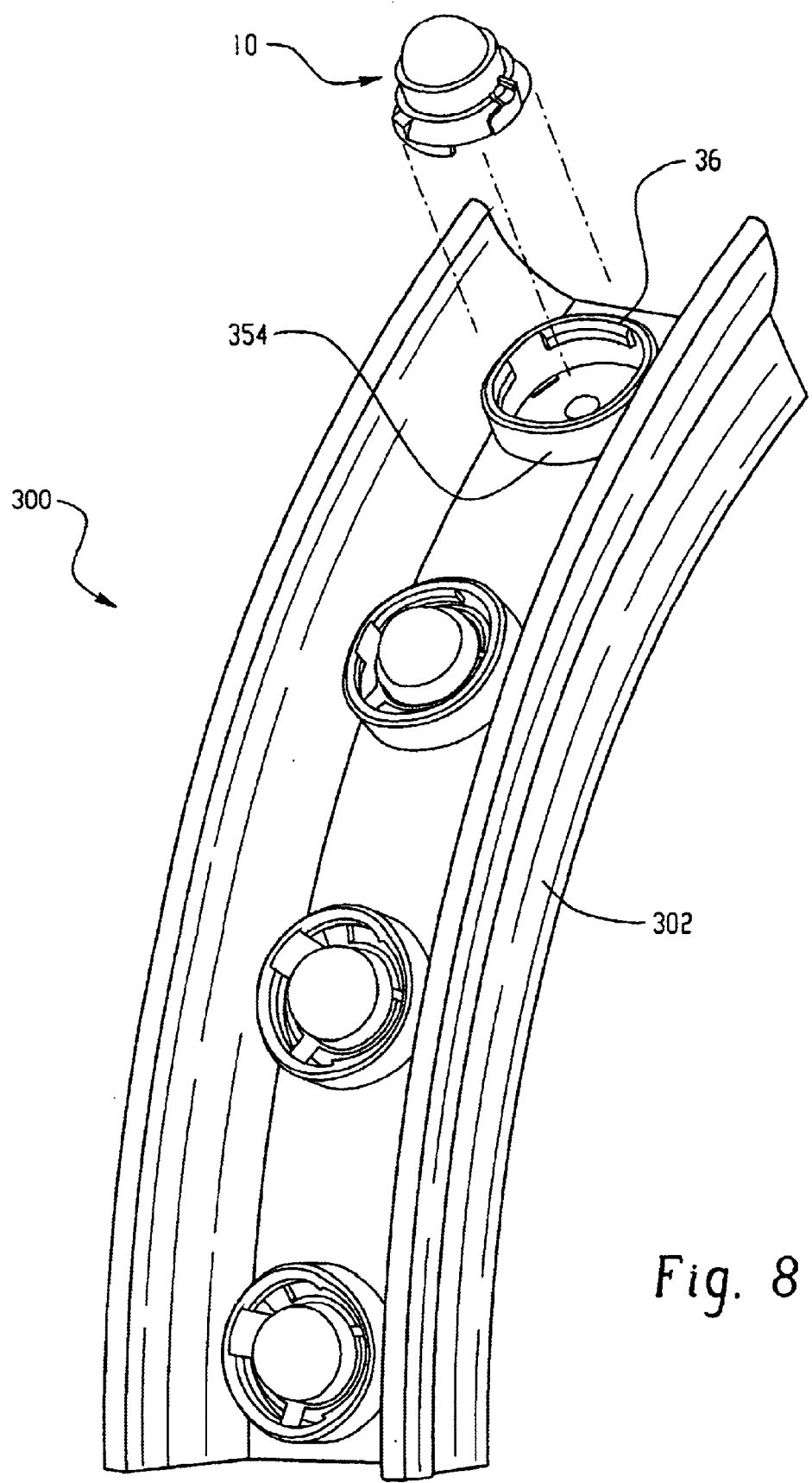
FIG. 8 is an illustration of another embodiment of the system comprising a carrier array and LED packages.

The LED package 10 also allows for significant improvement in the assembly process for products that use LEDs. Since the LED package 10 is not orientation-specific, it may be mounted in the mounting device 54 on the PCB 40 as shown in FIGS. 2 and 5, or as seen in FIG. 7 the LED package 10 may be mounted in a mounting device 254 in a light illumination device 200. Likewise, as shown in FIG. 8 the LED package 10 may be mounted in a mounting device 354 in an light fixture assembly 300, where in any of these embodiments the LED package 10 is mounted in any orientation, radially about its center. This eliminates the need for specific component orientation prior to assembly. The embodiments shown in FIGS. 1–5 and 7–8 may resemble a plug that allows the LED package 10 to be easily installed into the coupling device 36 of the mounting device 54,254,354 in a socket-like fashion without the need for heat or tools, and secured by rotating the LED package 10 until the protrusions 32 are fully engaged with the coupling devices 36.

Figure 9:
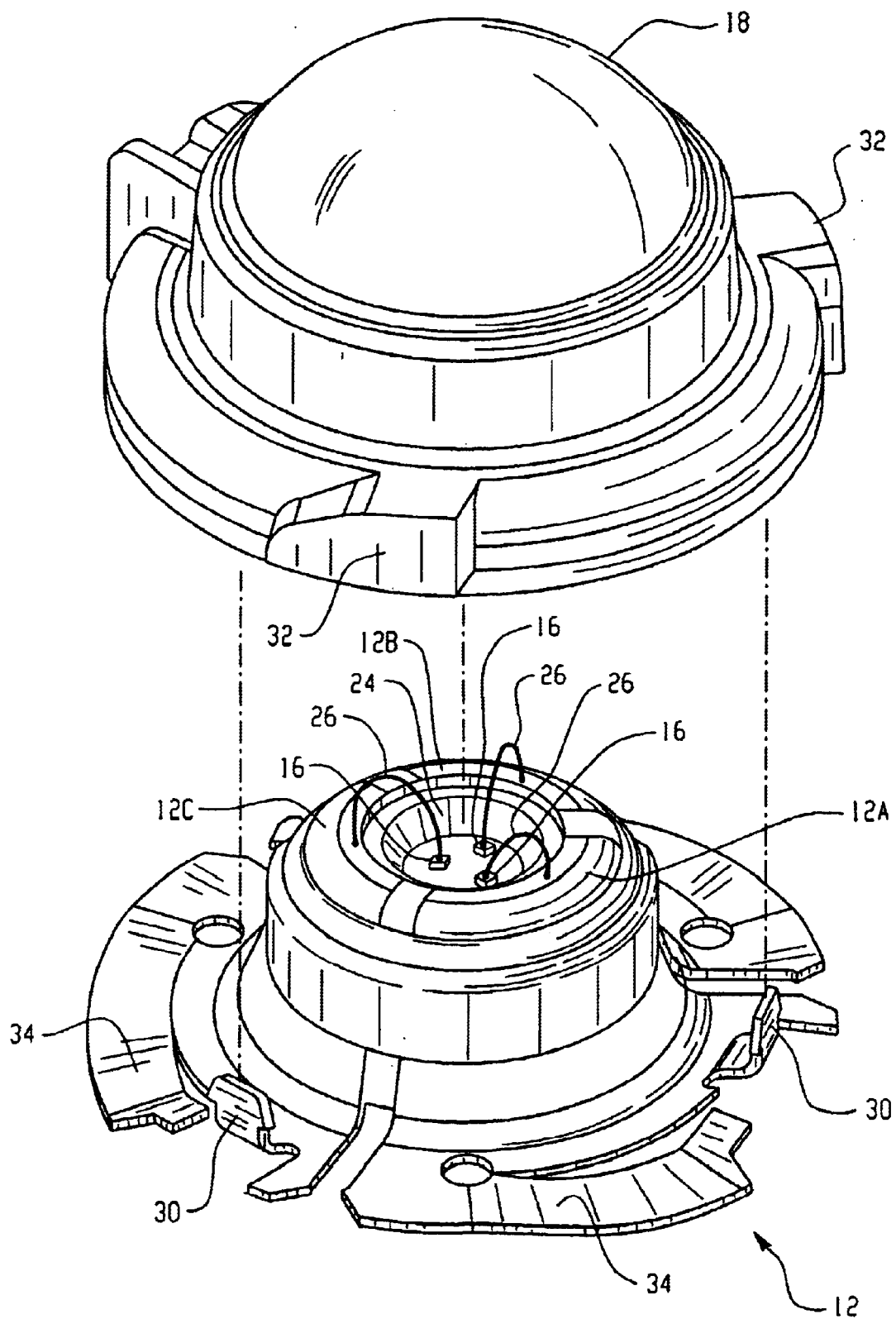
FIG. 9 is an exploded view of another embodiment of an LED package with plural LED dice.
Figure 10:
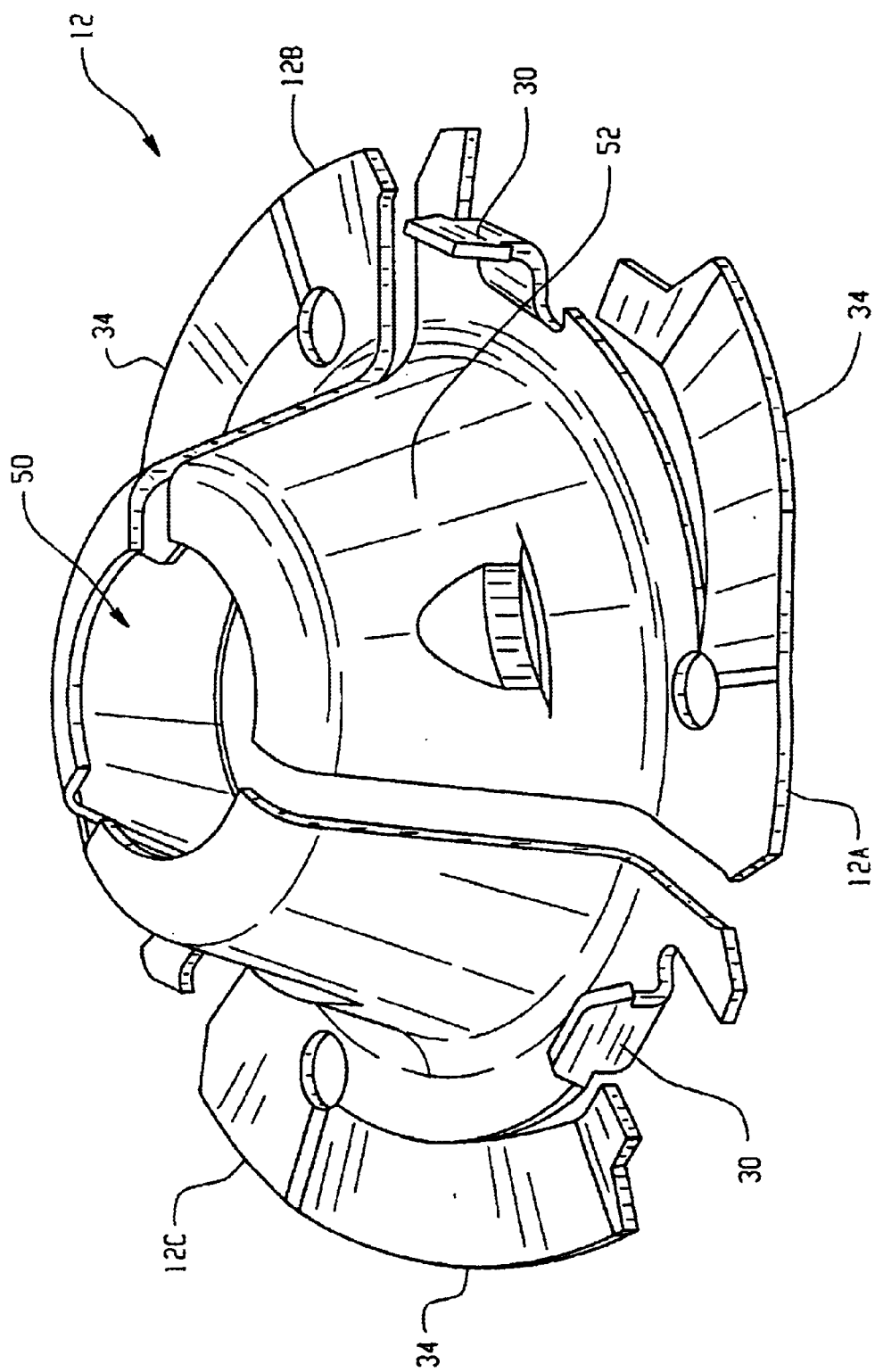
FIG. 10 is a perspective view of a segmented annular contact according to several embodiments.

Other embodiments of the LED package 10 utilize multiple LED dice 16, such as the embodiments shown in FIG. 9. The dice 16 may be any desired combination of LED colors, such as red, green and blue. In some of these embodiments, each of the LED dice 16 may be coupled via wire bonding 26 to different segments of the annular contact 12 to provide two or more separate annular contact segments for each LED die 16. An example annular contact 12 having three segments 12A–C is shown in FIGS. 9 and 10. The annular contact also has a centralized, preferably concentric window 50 formed in the "bottom" 52 providing access to the LED die 16 and wire bonding 26, and through which light emitted from the LED die 16 is distributed to the lens 18. As with other embodiments of the present invention, the segmented annular contact 12 may include flexible extensions 34 and complementary coupling devices 30. With the annular configuration of the embodiments, multiple wire bondings 26 from the annular contact 12 to the multiple LED dice 16 can be easily accommodated. Annular contact segments 12A–C may be electrically isolated to facilitate individual illumination of LED dice 16. Alternatively, the annular contact segments 12A–C may be electrically interconnected to simultaneously illuminate the LED dice 16. Electrical power may be coupled to multiple LED dice 16 by connecting the N-type material portions or contacts of the dice to the base contact 14 to form a first electrical connection to a power source. Alternatively, the P-type material contact of the dice 16 may be connected to the base contact 14. The remaining contacts of the dice 16 are then individually connected to particular annular contact segments 12A–C.

Figure 11:
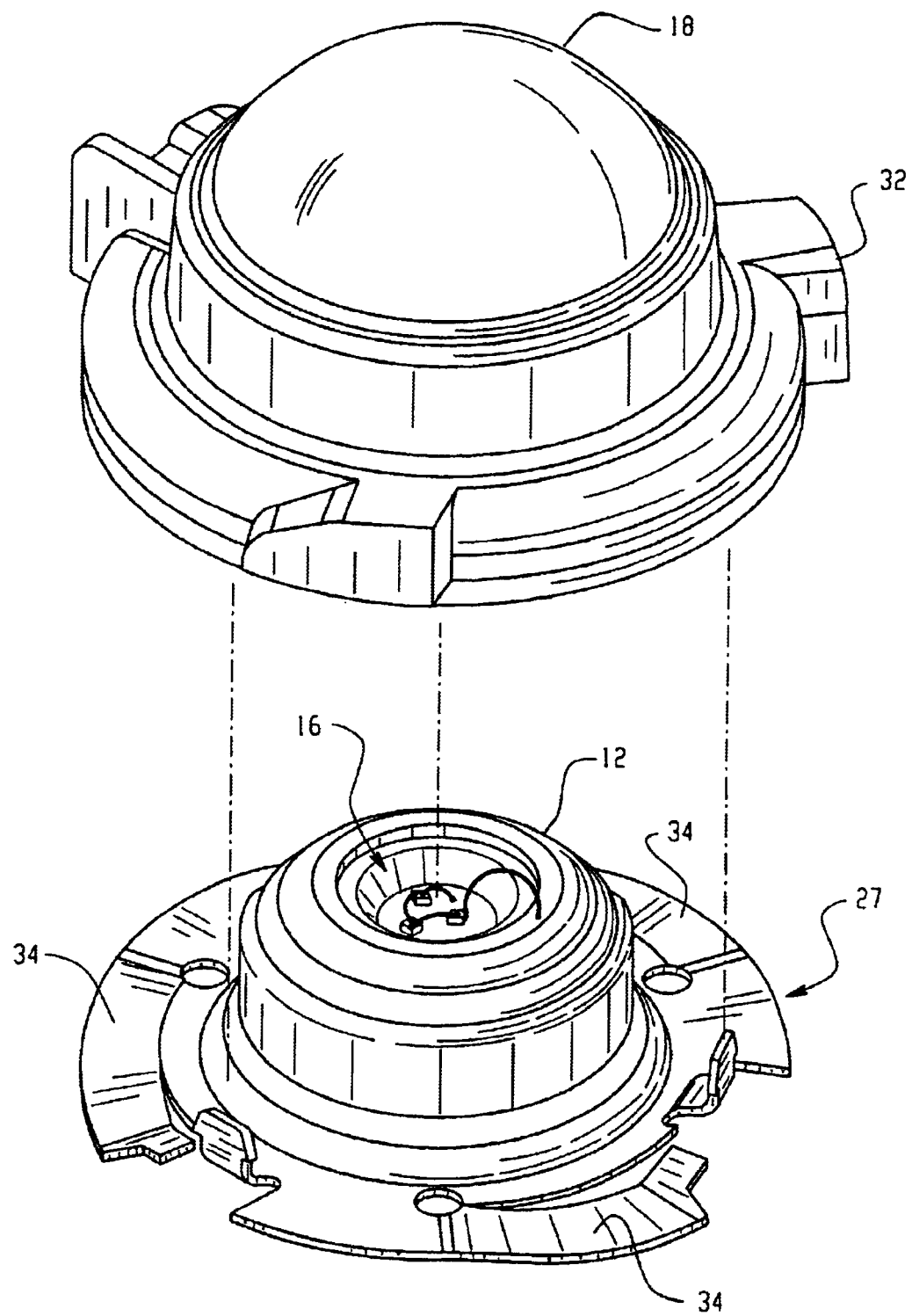
FIG. 11 is an exploded view of another embodiment of an LED package with plural LED dice connected in series.
Figure 12:
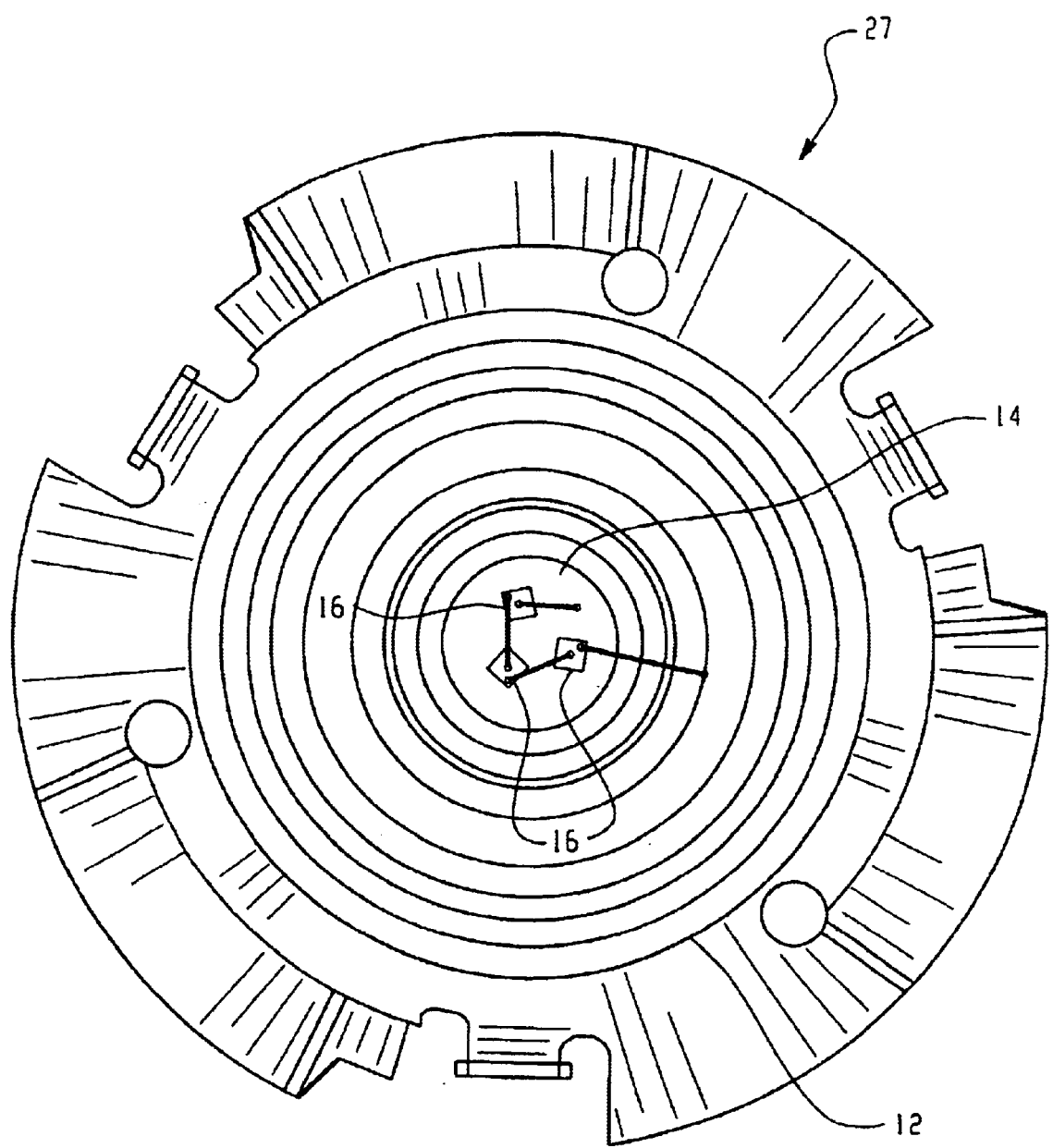
FIG. 12 is a plan view of a leadframe with plural LED dice connected in series according to an embodiment of the present invention.

In still another embodiment of the present invention, two or more LED dice 16 may be electrically insulated from the base contact 14 and electrically interconnected in series fashion, as illustrated in FIGS. 11 and 12 such that the N-type contact of a first LED die 16 is connected to a P-type contact of a second LED die with a wire bond. Additional LED dice 16 may be connected in the series string in a like manner. The P-type contact of the first LED die 16 is connected to the annular contact 12 with a wire bond while the N-type contact of the last LED die in the series is connected to the base contact 14. Alternatively, the P-type contact of the first LED die 16 may be connected to the base contact and the N-type contact of the last LED die in the series may be connected to the annular contact 12 with a wire bond. In yet another embodiment of the present invention, the P-type and N-type contacts may be located on the top surface of the die 16 to facilitate the wire bonding connections.

Figure 13A:
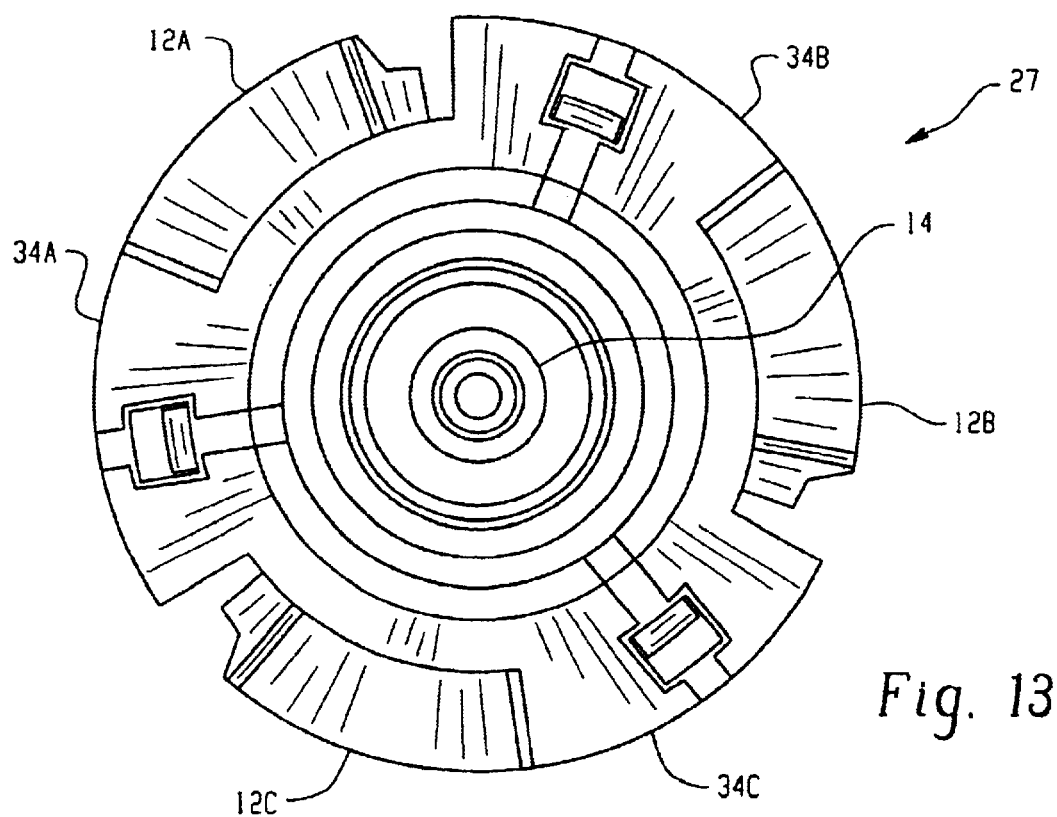
FIG. 13A is a plan view of an LED package showing an embodiment of the flexible extensions and base contact for connecting electrical power.
Figure 13B:
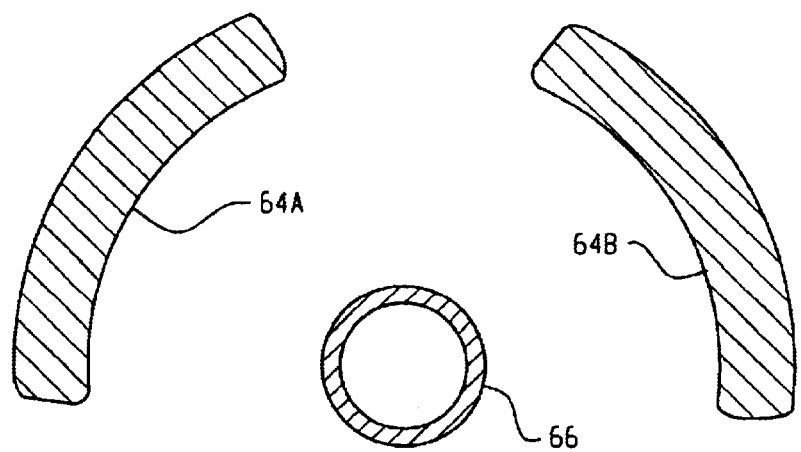
FIG. 13B is a plan view of electrical contacts on a PCB or a mounting device that correspond to the flexible extensions and base contact of FIG. 13A according to an embodiment of the present invention.
Figure 14A:
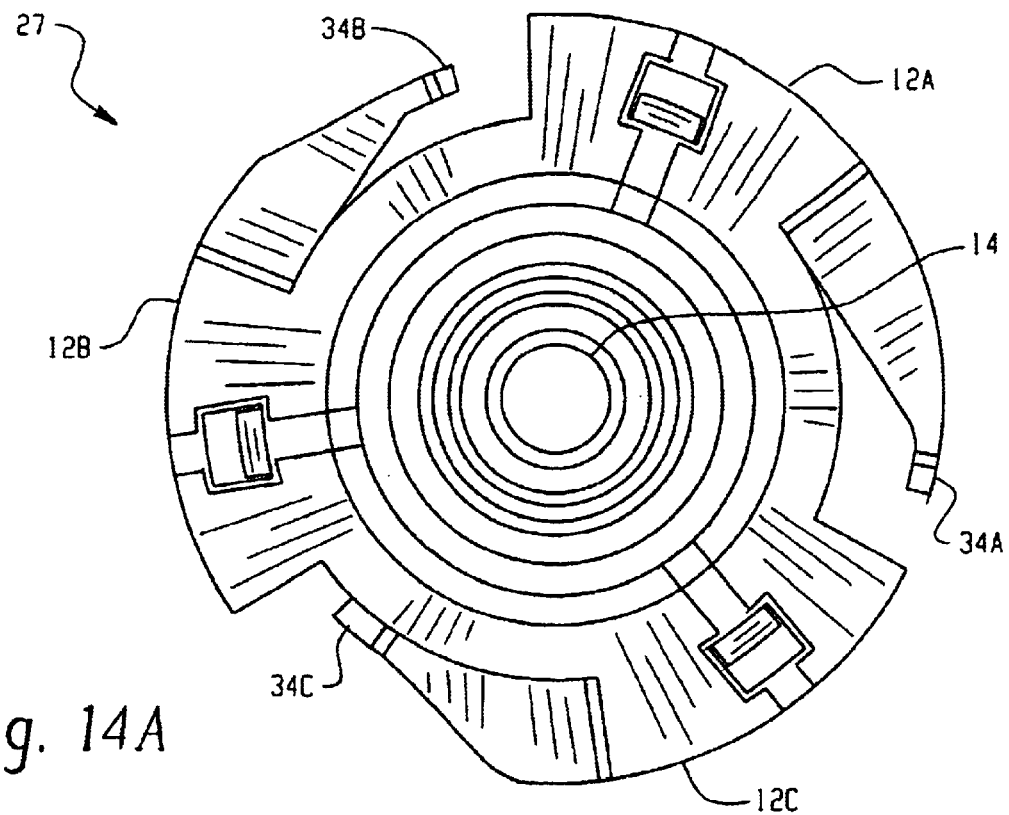
FIG. 14A is a plan view of an LED package showing an alternate embodiment of the flexible extensions and base contact for connecting electrical power.
Figure 14B:
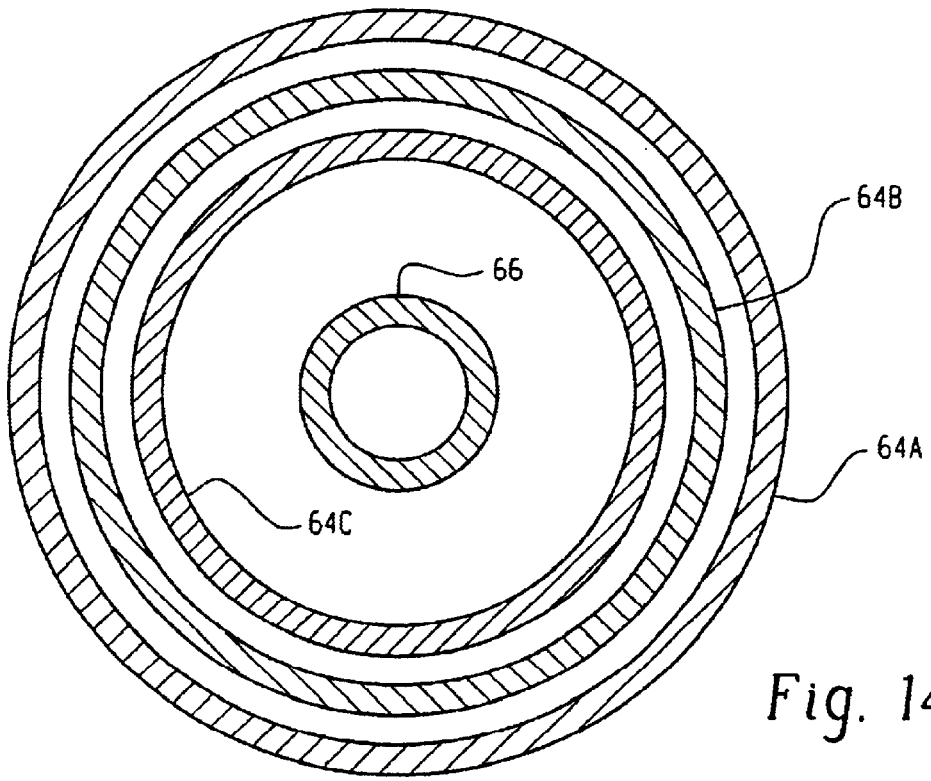
FIG. 14B is a plan view of electrical contacts on a PCB or a mounting device that correspond to the flexible extensions and base contact of FIG. 14A according to an embodiment of the present invention.

The flexible extensions 34 may be used to complete the electrical connection to a power source, as previously described. At least one flexible extension 34 may be connected to each LED die 16. The flexible extensions 34A–C may be configured to orient with corresponding contacts 64A–C on a PCB 40 or a mounting device 54 to facilitate individual coupling to the LED dice 16 via annular contact segments 12A–C, as shown in FIGS. 13A–B. The orientation of the flexible extensions 34 and corresponding contacts 64 may or may not be indexed. Similarly, the base contact 14 may couple to a corresponding contact 66 to complete the electrical circuit. Alternatively, the flexible extensions 34A–C may each have a differing diametrical pitch as shown in FIG. 14A to permit individual electrical coupling to corresponding contacts 64A–C, as shown in FIG. 14B, allowing individual electrical coupling to the LED dice 16 connected to annular contact segments 12A–C. The base contact 14 couples with a corresponding contact 66 to complete the electrical circuit.

In an alternate embodiment of the present invention, the leadframe 27 may be laser welded, rather than soldered, or otherwise mechanically coupled to the PCB 40 to provide electrical contact between the LED package 10 and the PCB 40, thereby minimizing the risk of overheating the LED die 16 during assembly of the LED package 10 into a product or subassembly. In yet another embodiment, the leadframe 27 may be laser welded to a contact arrangement to eliminate the need for a PCB 40.

Referring again to FIGS. 1–4, the LED package 10 utilizes a lens 18, which may be premolded and may be constructed of any one of a number of known materials, such as epoxy resin, urea resin, silicon resin, acrylic resin, glass, or the like, in various lens patterns or geometries. While shown in a circular embodiment, the shape of the lens 18 may be any generally symmetrical shape such as, without limitation, square, hexagonal, triangular and the like. The lens 18 provides the optical pattern for the LED package 10, and may be configured as a convex, concave, or collimating lens and may be optically clear or contain dispersants to diffuse the emitted light. In several embodiments, the inside surface of the lens 18 may be coated with a suitable light excitable material or the lens 18 may comprise a suitable light excitable material, which may be a phosphor material, for generating white light when excited with a blue, ultraviolet, or other color LED die 16. In other embodiments, the optical material 20 may comprise the light excitable material. In addition, the lens 18 both partially defines the cavity 22 for the optical material 20 and acts as a protective shield for the LED die 16 and attendant wire bonding 26. By premolding the lens 18, the optical output of the LED package 10 is easily modified by producing a different configuration, pattern, or geometry of the lens 18.

The LED die 16, which may have an index of refraction "n" of about 3.40, provides light output. The LED die 16 design and its method of manufacture are described in by Shimizu and others. The LED die 16 may be a multi-layer epitaxial semiconductor structure comprising an N-type material portion and a P-type material portion wherein the P-type material portion is electrically connected to an annular contact 12 and the N-type material portion is electrically connected to a base contact 14. Alternatively the N-type material portion may be electrically connected to the annular contact 12 and the P-type material portion may be electrically connected to the base contact 14. When electrically energized, the LED die 16 emits light of a wavelength predetermined by its chemical makeup. As discussed above, to produce the desirable white LED output, multiple colors of LED dice 16, such as red, blue and green, may be combined into a single LED package, as previously discussed and seen in FIGS. 9, 11 and 12. However, in other embodiments a blue, ultraviolet, or other color LED die 16 is used to excite a phosphor containing component in the lens 18 or in optical material 20 in order to produce a white light. Some prior art devices that have similar functions are Singer et al. that teaches the use of a phosphor layer on top of a blue LED die to produce a white LED, Shimizu et al. that teaches the use of phosphor materials embedded into a resin coating material place over the LED die, and Shimizu et al. that teaches the use of phosphor materials in the molded lens surrounding the LED die.

The optical material 20 may be an optical quality gel or grease or other soft optical material, which may have a refractive index "n" of about 1.70 or greater. The optical material 20 is contained in the lens 18 to possibly provide gradual transition of index of refraction between the LED die 16, which may have an index of refraction "n" of about 3.40, and the lens 18, which may have an index of refraction "n" of about 1.5. If the optical material 20 is an optical gel it may be of a type manufactured, for example, by Nye Optical. In addition, the soft optical material 20 reduces the stress on the wire bond 26 and LED die 16 caused by thermal expansion of the LED components. In one embodiment, the optical material 20 is formed so that it has varying indexes of refraction by arranging it in layers within the lens 18, where the layer having the highest index of refraction is closest to the LED die 16. In addition to facilitating assembly of the LED package 10, the varying layers of optical material 20 between the LED die 16 and the lens 18 also lessens the Fresnel losses within the LED package 10.

As previously discussed, in some embodiments a white emitted light is produced using a blue, ultraviolet, or other color LED die 16 by exciting light excitable materials, which may be fluorescent materials, that may be located in or on the lens 18, or similar to what is disclosed in Shimizu et al. in U.S. Pat. Nos. 5,998,925 and 6,069,440, the optical material 20 may contain a suitable phosphor material. However, unlike the Shimizu et al. patents, in some embodiments one or more layers of the optical material 20 replaces the prior art cured epoxy coating resin. In addition, in other embodiments, rather than being confined to the cavity 22 holding the LED die 16, the phosphor bearing optical material 20 fills the entire cavity 22, which is more effective for converting more of the excitation output into white light. In the circular embodiment of the lens 18 shown in the figures, the semispherical configuration of the phosphor bearing optical material 20 also provides more of an omni-directional output than the LEDs generally depicted by Shimizu et al.

The wire bonding 26 used to connect the annular contact 12 to the LED die 16 may be gold, but may also be made from copper, platinum, aluminum or alloys thereof. The diameter of the wire bonding 26 is typically in the area from 10–45 μm. As recognized in the art, because of thermal expansion coefficients between materials in LEDs made according to the prior art methods, wire bonds with diameters less than 25 μm are not recommended because of breakage at the bonding point. Accordingly, unlike the prior art, the wire bonding 26 is encapsulated in a soft optical material rather than a hard resin, thus permitting some expansion without loss of the electrical bonding. The wire bonding 26 is connected to the N-type material portion or P-type material portion of the LED die 16 and the annular contact 12 by conventional wire bonding techniques.

The base contact 14, which may be a copper slug or a heat sink, is provided at the center of the LED package 10 and serves as an electrical connection for the LED package 10. As discussed above, the base contact 14 is configured to have the die cup 24 at its uppermost surface, within which the LED die 16 is mounted. As also discussed above, the liquid crystal polymer 28 may be used to couple the base contact 14 into place within the annular contact 12 to form the leadframe 27. The liquid crystal polymer 28 also provides a barrier to seal the optical material 20 in place. In addition, because the liquid crystal polymer 28 is thermally coupled to the annular contact 12 it provides for additional heat sinking for the LED die 16. The inner surface of the die cup 24 may be finished with a reflective surface, via plating, polishing or other means, in order to direct the light emitted from the LED die 16 in a predetermined manner. The mass of the base contact 14 provides superior heat sinking for the LED die 16 to allow higher power to be applied to the LED die 16, resulting in higher lumen output.

Figure 15A:
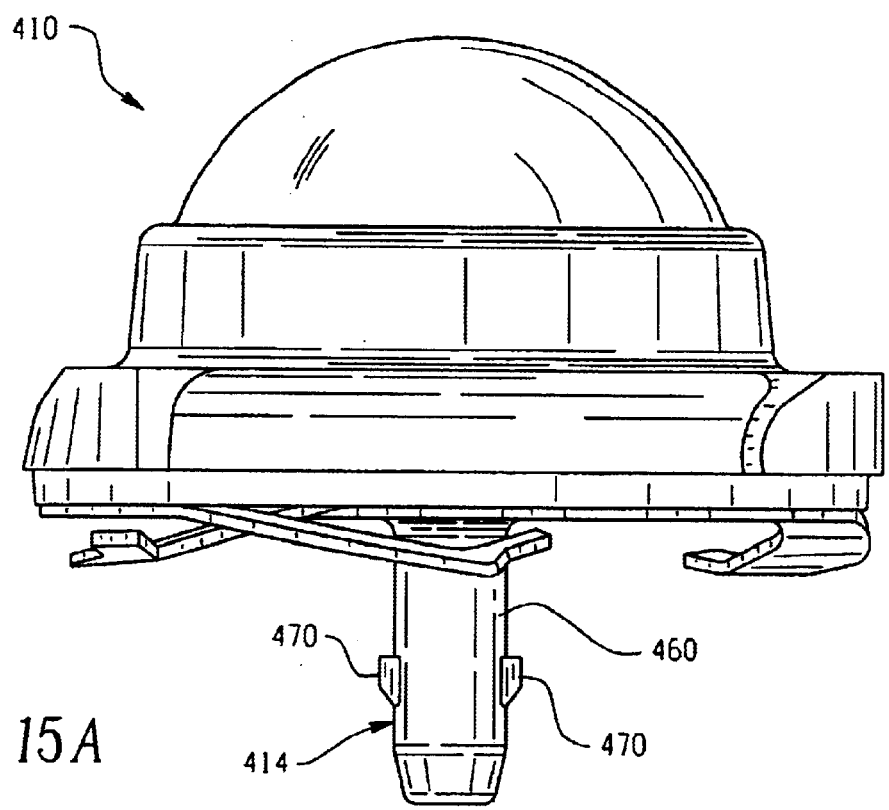
FIG. 15A is a side elevation of another embodiment of an LED package.
Figure 15B:
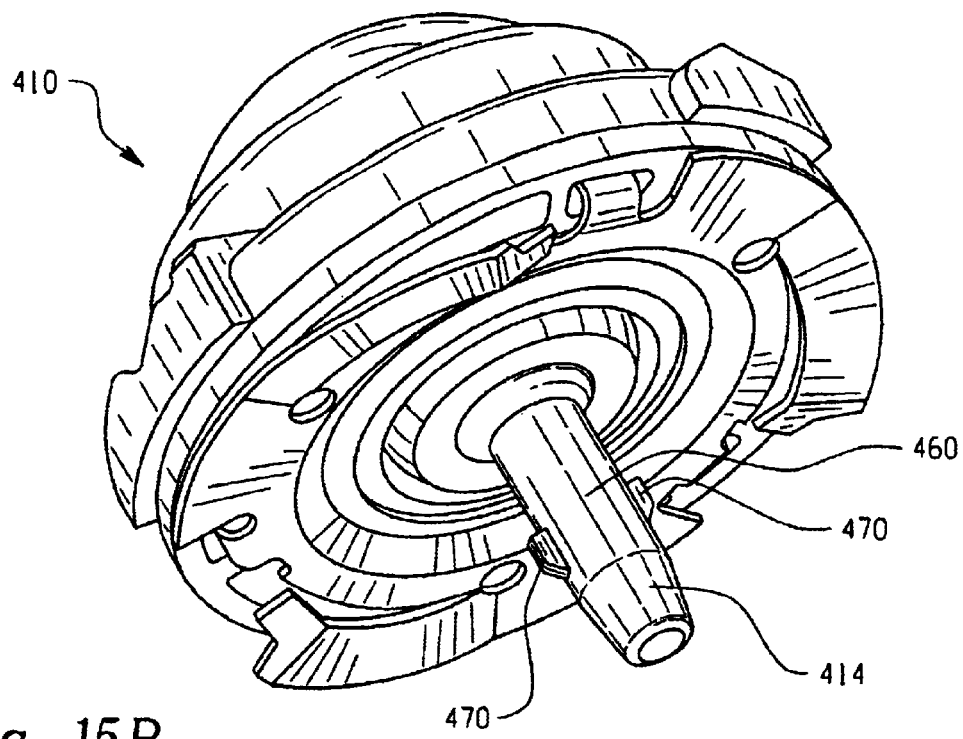
FIG. 15B is a bottom view of the LED package of FIG. 15A according to an embodiment of the present invention.
Figure 16A:
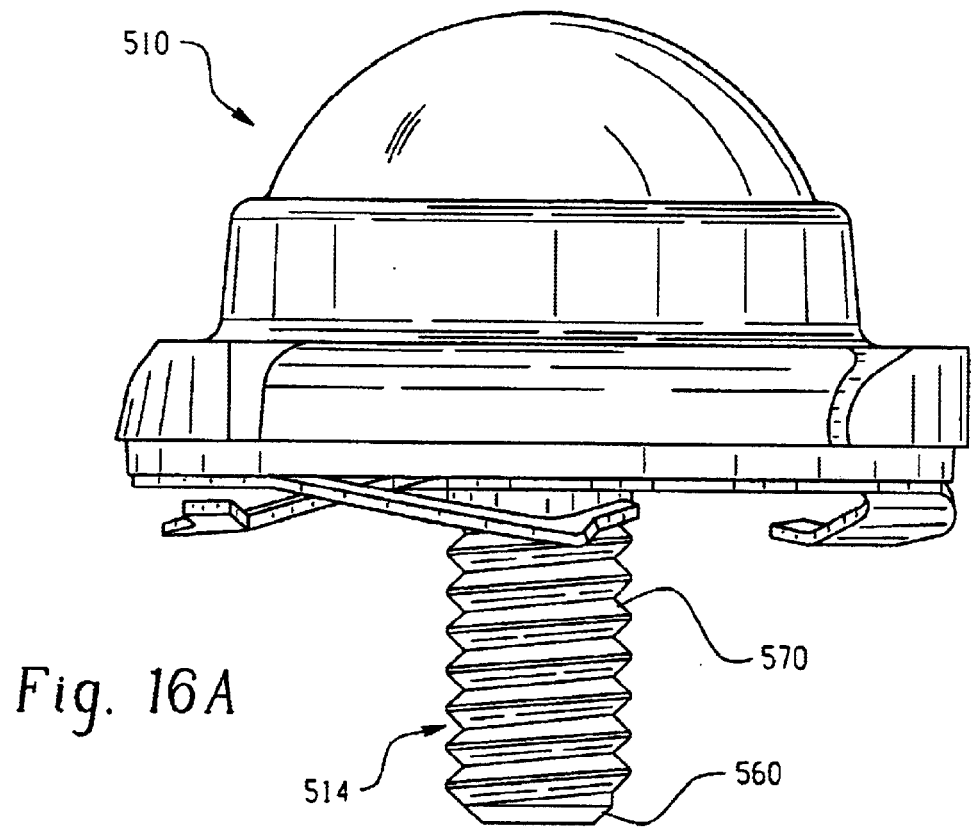
FIG. 16A is a side elevation of another embodiment of an LED package.
Figure 16B:
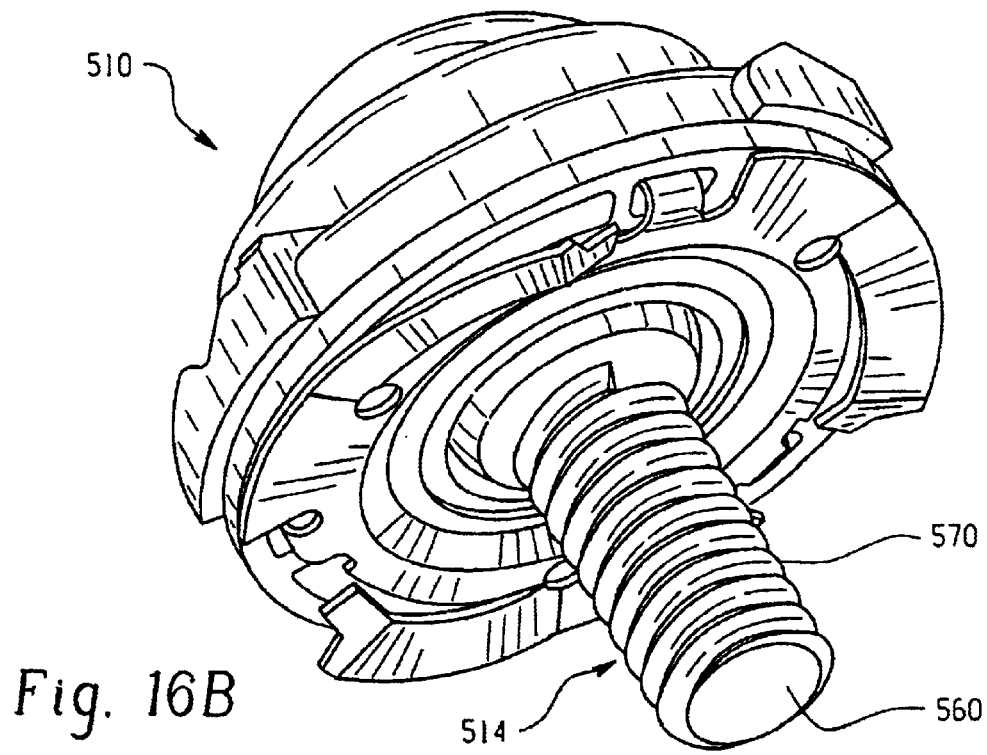
FIG. 16B is a bottom view of the LED package of FIG. 16A according to an embodiment of the present invention.

In some embodiments, the base contact 14 may be provided with an integral center post 60, as best illustrated in FIGS. 1–5. When so configured, the LED package 10 can be assembled into a PCB 40 assembly by normal soldering techniques or, without the use of heat, by fitting the LED package 10 into a complementary socket arrangement of mounting devices 32 and 36. In other embodiments when there is no integral center post, a lower base portion 62 of the base contact 14 can be laser welded or otherwise mechanically coupled to the PCB 40 or mounting device 54 to provide an electrical connection. In other embodiments, as seen in FIGS. 15A–B, an LED package 410 comprises a base contact 414 with a post 460 that comprises protrusions 470 that may be coupled to a complementary coupling device, which may be a bayonet-type coupling device. In other embodiments, as seen in FIGS. 16A–B, an LED package 510 comprises a base contact 514 with a post 560 having a threaded outer surface 570, which may be coupled to a complementary coupling device. The threaded outer surface 570 may serve to mechanically and/or electrically couple the LED package 510 to the complementary coupling device (not shown).

Figure 17:
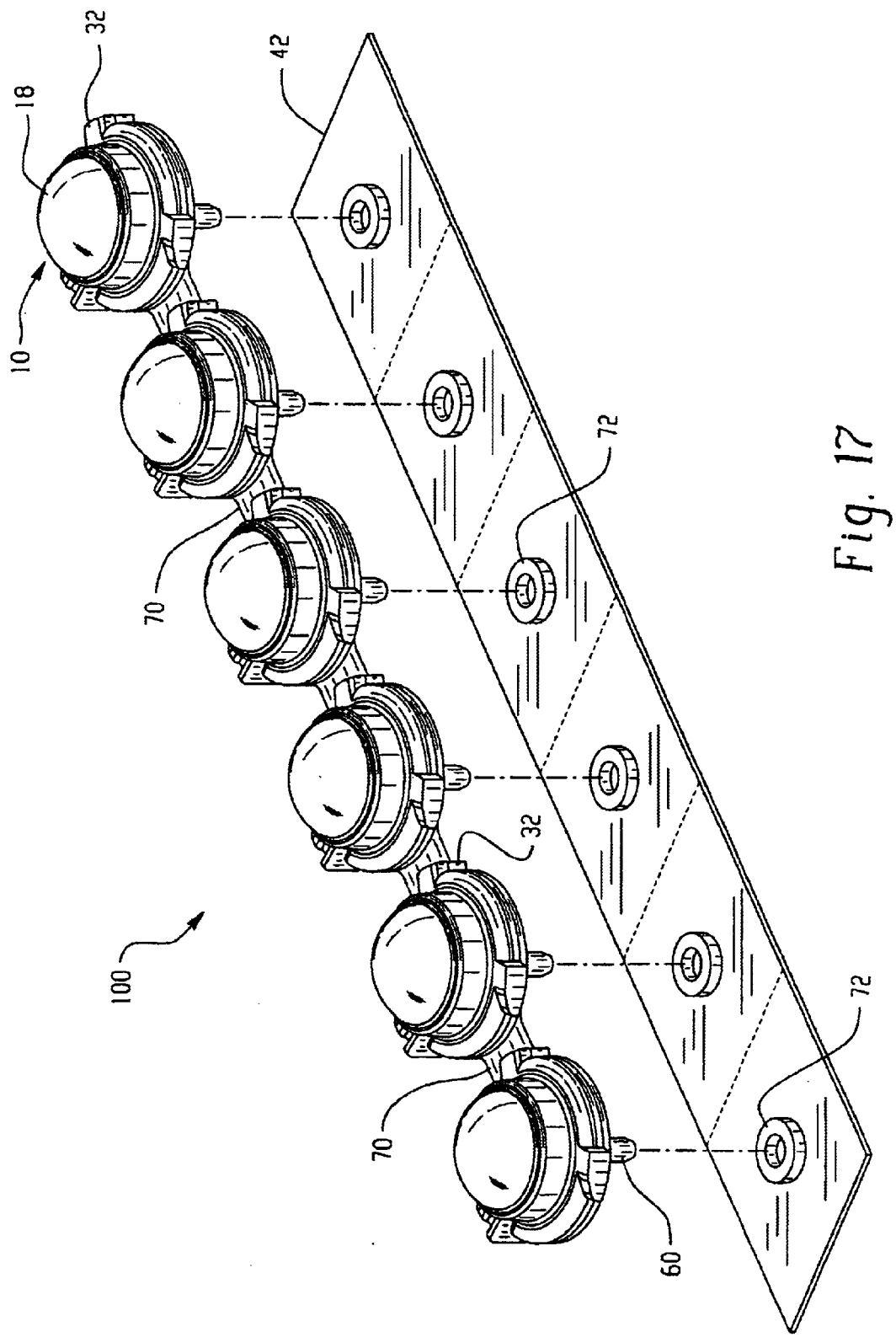
FIG. 17 is an illustration of another embodiment of a system comprising a carrier strip and LED packages.

As seen in FIG. 17, one embodiment provides an array of the annular contacts 12 that is formed continuously into the carrier strip 70, which may be an annular contact carrier strip, such as by stamping or other conventional means. This configuration facilitates manufacturing of the LED package 10. The anode carrier strip 70 also provides for alternate means of packaging the LED package 10 into subassemblies. For example, the carrier strip 42, which may be a base contact carrier strip, containing receiving devices 72 having a common base contact may be employed as one assembly. Each of the center posts 60 of each of the LED packages 10 may be connected to the receiving devices 72 on a carrier strip 42, where each of the annular contacts 12 may be connected using a carrier strip 70. In such an application, only one electrical connection to the base contact via the carrier strip 42 would be necessary. Likewise, the annular contact carrier strip 70 can be configured to have a common electrical connection, in which case an entire strip of the LED packages 10 can be easily assembled by making only two electrical connections. The base contact carrier strip 42 and the anode carrier strip 70 may be periodically scored (shown as dashed lines) along their length to enable the base contact carrier strip 42 and the annular contact carrier strip 70 to be in broken into predetermined lengths.

The LED package 10 may be incorporated directly into products to eliminate the need for secondary coupling devices and printed circuit boards. FIG. 7 illustrates a portable lighting illumination device 200, such as a flashlight. The LED package 10 is mounted into a mounting device 254. The mounting device 254 serves to mechanically secure the LED package 10 within the flashlight 200, and also facilitates electrical connections between the LED package 10 and the batteries 256. A housing 258 and lighthead 260 provide a secure package for the flashlight components.

Likewise, the LED package 10 may be directly incorporated to a light fixture 300, as shown in FIG. 8. A housing structure 302 holds one or more mounting devices 354. The mounting devices 354 mechanically secure the LED packages 10 to the housing structure 302 and also facilitate electrical connections to the LED package. The light fixture 300 may be any type of interior or exterior, fixed or portable light. Examples include, but are not limited to, position lights, reading lights, indicators, night lights, backlights, and marker lights. Additional examples may include automotive signaling devices such as stop lights, brake lights, taillights indicator lights, turn signals and hazard lights.

The various embodiments have been described in detail with respect to specific embodiments thereof, but it will be apparent that numerous variations and modifications are possible without departing from the spirit and scope of the embodiments as defined by the following claims.

What is claimed is:

1. A system comprising an LED package, the LED package comprising:
   an annular contact;
   a base contact coupled to the annular contact to form a leadframe;
   an LED die coupled to the base contact and the annular contact;
   a lens coupled to the leadframe; and
   an optical material located in a cavity defined by the lens, the base contact, and the annular contact.

2. The system of claim 1 wherein the annular contact is an anode.

3. The system of claim 1 wherein the annular contact is a cathode.

4. The system of claim 1 further comprising a mounting device, wherein the LED package is mechanically coupled to the mounting device via the lens.

5. The system of claim 1, further comprising a light fixture.

6. The system of claim 1 further comprising:
   an anode strip comprising an array of anodes utilized to form an array of the LED packages; and
   a carrier strip comprising receiving devices to receive the array of LED packages.

7. The system of claim 1 wherein the annular contact and the lens comprise complementary coupling devices for matingly engaging the annular contact and lens to one another.

8. The system of claim 7 wherein the complementary coupling devices are annular contact barbs and lens openings.

9. The system of claim 1 wherein the lens is coupled to the leadframe with an adhesive.

10. The system of claim 1 wherein the LED die is comprised of a plurality of LED dice.

11. The system of claim 10 wherein the annular contact is separated into two or more segments to provide isolated electrical contact to each LED die.

12. The system of claim 10 wherein the LED die is electrically insulated from the base contact and the LED die contains both P-type and N-type contacts on the top surface of the die such that the LED die can be electrically connected in series via wire bonding.

13. The system of claim 1 wherein the LED die is coupled to the base contact via a thermally and electrically conductive epoxy or solder and the LED die is coupled to the annular contact via wire bonding.

14. The system of claim 1 wherein the base contact further comprises a heat sink.

15. The system of claim 1 wherein the base contact further comprises a die cup into which the LED die is coupled.

16. The system of claim 1 wherein the annular contact and base contact are coupled together with liquid crystal polymer to form a leadframe.

17. The system of claim 1 wherein a portion of the lens comprises light excitable material such that the system emits white light.

18. The system of claim 1 wherein a portion of the lens comprises dispersants to diffuse output light.

19. The system of claim 1 wherein the optical material is a non-resilient material.

20. The system of claim 1 wherein the optical material is a grease.

21. The system of claim 1 wherein the optical material is a non-liquid material.

22. The system of claim 1 wherein the optical material is a resilient material.

23. The system of claim 1 wherein the optical material is a rigid material.

24. The system of claim 1 wherein the optical material is a liquid material.

25. The system of claim 1 wherein the optical material is a silicone material.

26. The system of claim 1 wherein the optical material is a UV stable material.

27. The system of claim 1 wherein the cavity is filled with the optical material.

28. The system of claim 1 wherein the optical material comprises a light excitable material.

29. The system of claim 28 where a white light is produced by the light excitable material.

30. The system of claim 1 wherein a portion of the lens is coated with light excitable material such that the system emits white light.

31. The system of claim 1 wherein the system is incorporated into an automotive signaling device.

32. The system of claim 1 wherein the system is incorporated into a flashlight device.

33. The system of claim 1 further comprising a socket device that is mounted on a printed circuit board, wherein the lens is mechanically coupled to the socket device via lens protrusions and securely biased in the socket device by flexible extensions extending from the annular contact.

34. The system of claim 1 wherein the base contact comprises a threaded portion, wherein the threaded portion is used to couple the LED package to the system.

35. The system of claim 1 further comprising:
   a mounting device; and
   protrusions adjacent an attachment end of the base contact,
   wherein the LED package is mechanically mounted to the mounting device via the protrusions.

36. The system of claim 1 wherein the lens comprises an optical geometry to diffuse illumination from the LED die.

37. The system of claim 1 wherein the lens comprises an optical pattern to diffuse illumination from the LED die.

38. The system of claim 1 wherein the lens comprises an optical geometry to produce a desired light pattern.

39. The system of claim 1 wherein the lens comprises an optical pattern to produce a desired light pattern.

40. A system comprising:
   a mounting device; and
   an LED package, the LED package comprising:
   a leadfrarne comprising:
      an annular contact with a central opening;
      a base contact having heat sink, coupled to the annular contact adjacent the central opening;
      an LED die coupled to the base contact and via wire bonding to the annular contact;
   a lens coupled to the leadframe, the lens comprising protrusions that are utilized to mechanically secure the LED package to the mounting device; and
   optical material located in a cavity defined by the lens and the leadframe.

41. The system of claim 40 wherein the optical material is a non-resilient material.

42. The system of claim 40 wherein the optical material is a grease.

43. The system of claim 40 wherein the optical material is a non-liquid material.

44. The system of claim 40 wherein the optical material is a resilient material.

45. The system of claim 40 wherein the optical material is a rigid material.

46. The system of claim 40 wherein the optical material is a liquid material.

47. The system of claim 40 wherein the optical material is a silicone material.

48. The system of claim 40 wherein the optical material is a UV stable material.

49. A system comprising an LED package, the LED package comprising:

an annular contact;

a base contact coupled to the annular contact to form a leadframe;

an LED die coupled to the base contact and the annular contact;

a lens coupled to the leadframe; and a cavity defined by the lens, the base contact, and the annular contact.

50. The system of claim 49 further comprising a material in the cavity.

51. The system of claim 50, wherein the material is one of a resilient, rigid, non-resilient, grease, liquid and non-liquid material.

52. The system of claim 1 wherein the annular contact further comprises flexible extensions.

53. The system of claim 52 wherein the flexible extensions each have a differing diametral pitch.

* * * * *